United States Patent [19]

Jordan et al.

[11] 4,086,101

[45] Apr. 25, 1978

[54] PHOTOVOLTAIC CELLS

[75] Inventors: John Francis Jordan; Curtis Magill Lampkin, both of El Paso, Tex.

[73] Assignee: Photon Power, Inc., El Paso, Tex.

[21] Appl. No.: 631,815

[22] Filed: Nov. 14, 1975

Related U.S. Application Data

[63] Continuation-in-part of Ser. No. 508,570, Sep. 23, 1974, abandoned, which is a continuation-in-part of Ser. No. 431,705, Jan. 8, 1974, Pat. No. 3,880,633.

[51] Int. Cl.$^2$ .................. H01M 1/00; B05D 5/12
[52] U.S. Cl. .................. 136/89 CD; 136/89 TF; 427/54; 427/74; 427/75; 427/76; 427/314; 427/329; 427/377; 427/419 F; 427/427; 427/430 R; 204/50 R; 204/56 R; 357/16; 357/62; 29/572
[58] Field of Search .................. 136/89 CD, 89 TF; 427/74, 430, 54, 75, 76, 314, 377, 329, 419, 427; 204/56 R, 50 R; 29/572; 357/16, 62; 428/432, 539

[56] References Cited

U.S. PATENT DOCUMENTS

| | | | |
|---|---|---|---|
| 3,148,084 | 9/1964 | Hill et al. | 427/74 |
| 3,411,050 | 11/1968 | Middleton et al. | 136/89 |
| 3,416,956 | 12/1968 | Keramidas et al. | 427/74 |
| 3,885,058 | 5/1975 | Duy et al. | 427/74 |
| 3,902,920 | 9/1975 | Jordan et al. | 136/89 |
| 3,959,565 | 5/1976 | Jordan et al. | 428/432 |
| 3,975,211 | 8/1976 | Shirland | 29/572 |

*Primary Examiner*—Michael F. Esposito
*Attorney, Agent, or Firm*—Bard, Springs, Jackson & Groves

[57] ABSTRACT

A method of making low cost photovoltaic cells on a large scale basis by means of a continuous process of coating sheet glass while the sheet glass moves in and has its under surface immersed in a tank of molten material, comprising forming the film of CdS microcrystals on the glass sheet, which has previously been coated with transparent $SnO_x$ to a thickness of about 0.3 to 0.6 microns. A water solution of a cadmium salt, a sulphur compound, and an aluminum containing soluble compound is intermittenty sprayed on said glass while its exposed surface is maintained at a constant temperature in the range 500° F to 1100° F and while irradiating the surface with intense ultraviolet light so as to form a film of CdS microcrystals. This CdS film has Al impregnated within the stratum of the film adjacent to the $SnO_x$, but only optionally has Al impregnated in the stratum of the CdS film adjacent to the exposed surface of the CdS film. After the spray process is completed, the temperature of the sheet of glass is brought to the range 450° C to 550° C, 525° being optium. After heating, the glass is cooled to approximately room temperature and the exposed surface of the CdS is converted to $Cu_xS$, the x of $Cu_xS$ being as close to 2 as possible, by dipping the coated glass in a solution comprising: a solvent, which may be water; a weak acid, such as tartaric acid, citric acid, or lactic acid; a copper containing compound; and, optionally, a quantity of $H_2Ce(SO_4)_4$ and NaCl, or some other chloride; or by electroplating to form a film of $Cu_xS$; or, by a combination of dipping and electroplating. The $Cu_xS$ forming process proceeds by ion exchange, i.e., S from CdS combines with Cu to form $Cu_xS$. Cu is then applied over the $Cu_xS$, and the cell is cured at a temperature in the range 400° F to 500° F.

56 Claims, No Drawings

PHOTOVOLTAIC CELLS

This application is a continuation-in-part of our prior application for U.S. Pat., Ser. No. 508,570, filed Sept. 23, 1974, now abandoned, which in turn is a continuation-in-part of our prior application for U.S. Pat., Ser. No. 431,705, filed Jan. 8, 1974, and assigned to the same assignee as is the latter application. Application Ser. No. 431,705 issued as U.S. Pat. No. 3,880,633 on Apr. 29, 1975.

BACKGROND OF THE INVENTION

It is known to form photovoltaic cells by coating on a hot sheet of Nesa glass, or glass previously coated with $SnO_x$, a thin film of CdS, by spraying a water solution of compounds which form a layer of CdS microcrystals on the $SnO_x$, and providing a $Cu_xS$ heterojunction as a layer on the CdS layer, and forming electrodes on the film of $Cu_xS$. In accordance with out prior application, referred to hereinabove, the $Cu_xS$ layer was formed by spraying a $Cu_xS$ forming solution on the CdS film while the substrate was hot. In accordance with the present application, the $Cu_xS$ may instead be formed by dipping or by electroplating, or by a combination of both, at or near room temperature.

Photovoltaic cells have heretofore utilized relatively thick films of CdS, or have resorted to other expedients to obviate the difficulty that CdS films generally permit permeation by $Cu_xS$ is formed by dipping or electroplating, i.e., by ion exchange. This permeation provides short circuits between the $Cu_xS$ layer and the $SnO_x$, the latter constituting the negative electrode of the cell, rendering the cell inoperative. In order to convert solar energy to electrical energy on a large scale, square miles of solar cells may be required. Since Cd is a rare and expensive metal, it becomes important to form photovoltaic cells with minimum quantities of CdS and hence with extremely thin CdS films. Moreover the cells must be reliably fabricated and have long life.

We have produced CdS photovoltaic cells in which the layer of CdS is about 2 to 4 microns thick, yet which show zero shorting permeation, the layers being highly impervious to $Cu_xS$ or Cu containing solution, in an ion exchange process. We have heretofore used the method of spraying a CdS forming solution on a glass coated with $SnO_x$, intermittently and covering only a small portion of the glass at a given point in time, while maintaining the surface of the glass at uniform and constant temperature in the range between 500° F and 1100° F. According to the present invention, in one embodiment, multiple sprays are required to form the CdS layer. Each spray comprises a solution containing a cadmium compound and a sulphur containing compound. However, to one spray is added $AlCl_3 \cdot 6H_2O$, in proportions such that the Al content is 10 to 50 molar percent of the total metal ion content of the solution, and the quantity of sulphur containing compound is increased as required to combine with the Al. In a superposed spray solution, optionally no $AlCl_3 \cdot 6H_2O$ is included, or a very much reduced quantity of $AlCl_3 \cdot 6H_2O$, such that the layer formed by the superposed spray contains little or no impregnated Al. Instead of applying two discrete films, one formed from a spray containing a large quantity of aluminum compound and the other containing little or none, a single film may be formed by gradually decreasing the aluminum compound content of the solution being sprayed in proceeding from the stratum of the film adjacent to the $SnO_x$ layer to the stratum of the film adjacent to the exposed surface of the CdS film. In this manner the stratum of the CdS film adjacent to the $SnO_x$ layer is impregnated with significantly greater quantities of Al than the stratum of the film adjacent to the exposed surface of the CdS film. The quantity of the sulphur containing compound is proportioned to the quantity of the aluminum compound used.

After heat treating at a temperature in the range 450° C to 550° C, it is found that the portion of the CdS layer in which Al is impregnated is extremely hard and highly adherent to the $SnO_x$ layer, so that it can only with difficulty be removed by application of acid or by scraping and is highly impervious to chemicals involved in forming a $Cu_xS$ layer by ion exchange, or to $Cu_xS$, and inhibits diffusion of Cu through a CdS layer. The impregnation of Al in the CdS film in the relatively large quantities resulting from use of solutions containing Al in a quantity representing 10 to 50 molar percent of the total metal ion content of the solution does not constitute a doping procedure, such as disclosed in Middleton, et al., U.S. Pat. No. 3,411,050. Rather it comprises a new compound or material, or a new crystalline form, having properties quite distinct from those of CdS or CdS impregnated with only small amounts of Al. It has been found that if the entire film of CdS is heavily impregnated with Al the cell remains operative, but at reduced efficiency. In an alternative embodiment, hydrochloric acid is added to the solution utilized to form the CdS layer containing aluminum. Also disclosed is an alternative embodiment of the spray process wherein a spray comprised of essentially uniform droplets is utilized.

SUMMARY OF THE INVENTION

A method of fabricating a photovoltaic cell comprising spraying on a hot insulating transparent substrate coated with a transparent conducting film, a solution comprising a solvent, a cadmium salt, a sulphur containing compound and an aluminum containing soluble compound in heavy concentration. Thereafter a further solution comprising a cadmium salt and a sulphur containing compound, having little or no included aluminum may be sprayed onto the substrate. The aluminum concentration in the resulting CdS layer may be concentrated most heavily in the underside of the CdS layer, i.e., be dispersed throughout the CdS layer, but with a much heavier concentration at the bottom of the layer than occurs at the top, where no Al may occur or only little, or the Al may be dispersed equally throughout. The spray process is conducted while the sprayed surface of the substrate is maintained at a constant temperature in the range about 500° F to 1100° F. After the spray process is completed, the coated substrate is heated in an oxygen containing atmosphere to about 525° C, then cooled to approximately room temperature. Thereafter, the exposed surface of the CdS film is converted to $Cu_xS$, either by dipping, electroplating, or a combination of both to form a heterojunction. The exposed surface of the CdS film may also be converted to $Cu_xS$ by spraying thereon a suitable copper containing solution. Thereafter, an electrode is formed over the $Cu_xS$ layer.

DETAILED DISCLOSURE

The disclosure of the co-pending parent application is hereby imported by reference into this application, the process as there disclosed being applied to a glass substrate as the glass substrate travels along a tank containing a molten salt or a molten metal. The sheet of glass may be supported solely by the molten liquid or partially by the molten liquid and partially by extraneous supports, so that its bottom surface is immersed in the liquid and the liquid continuously supplies heat to the substrate. In the course of spraying the substrate with solution, the upper exposed surface of the substrate is cooled by the spray. It is then necessary to conduct the spraying operation intermittently, and over so small a portion of the substrate surface at any instant of time, that the substrate surface can acquire from the molten material enough heat to recover the temperature of the exposed surface of the substrate between the sprays applied to any area. This process provides a uniform layer thickness, and also facilitates maintenance of constant temperature, or maintains the temperature more nearly constant than is otherwise feasible.

Subject to the considerations stated in the immediately preceding paragraph, glass is assumed to be at approximately the temperature of the heated liquid, the temperature of which is such as to maintain the exposed surface of the glass at a temperature in the range 500° F to 1100° F, and it is assumed for the purpose of the present invention that the glass has been coated with $SnO_x$ in a thin transparent layer, as by the methods taught in our parent application. Spraying is advantageously accomplished under intense ultraviolet light, which is absorbed by CdS and enhances the internal energy of the CdS crystals.

EXAMPLE I

In a first example of the invention, two solutions are prepared. The first solution may be in the proportion:

2 liters Water
60 cc: 1 Molar $CdCl_2$ solution
74 cc: 1 Molar thiourea solution
1.95 gm: $AlCl_3 \cdot 6 H_2O$ The second solution employed is in the proportion:

5 liters Water
150 cc: 1 Molar thiourea solution
150 cc: 1 Molar $CdCl_2$ solution
2.5 cc: Hydrochloric acid While thiourea is specified as a component, its function is to produce sulphur. Other compounds which are soluble in water, and which give up sulphur, can be substituted. Specifically NN DMthiourea has been employed, but thiourea is the least expensive compound which has been found satisfactory. The specific quantity of $AlCl_3 \cdot 6 H_2O$ may be varied over a wide range, provided that the quantity of sulphur available is proportionally varied. The purpose of Al inclusion is to provide at least a stratum of CdS by combination of $CdCl_2$ with thiourea which is heavily impregnated with an aluminum compound, the exact nature of which is unknown. The aluminum content of the solution may be varied from 10 to 50 molar percent of the total metal ion content of the solution. Even higher molar percentages of aluminum may be employed, but higher percentages have not been found to produce superior performance. The CdS film having Al impregnated therein formed with a solution having an Al content of from 10 to 50 molar percent of the total metal ion content of the solution is found to have properties quite different from CdS films containing no aluminum or relatively small amounts of aluminum. The layer is extremely hard, impervious to $Cu_xS$ or Cu, and is highly adherent to the $SnO_x$. The reason for these physical properties is not known.

The second solution contains no aluminum, on the example cited, but in fact some aluminum may be included in the form of $AlCl_3 \cdot 6 H_2O$. Inclusion of HCl is optional, and for reasons unknown increases slightly the output of the cell, but so far as is known does not otherwise affect the operation of the cell.

EXAMPLE IA

Similar to EXAMPLE I, but with the solutions being differently comprised. The first solution may be in the proportion:

8 liters: Water
18.63 gm: $CdCl_2 \cdot 2\frac{1}{2} H_2O$
8.77 gm: Thiourea
6.96 gm: $AlCl_3 \cdot 6 H_2O$
2 cc: Hydrochloric acid The second solution may be in the proportion:

4 liters: water
24.70 gm: $CdCl_2 \cdot 2\frac{1}{2} H_2O$
10.96 gm: Thiourea

EXAMPLE II

A solution of water, $CdCl_2$, thiourea and $AlCl_3 \cdot 6 H_2O$ is sprayed on glass coated with $SnO_x$, but as the spraying proceeds the proportion of $AlCl_3 \cdot 6 H_2O$ to $CdCl_2$ is gradually decreased, for example, logarithmically. For example, as much as 50 molar percent aluminum may be present in the solution forming the lowermost part of the CdS film, and zero or substantially zero molar percent aluminum in the solution forming the upper surface of the film. As the quantity of $AlCl_3$ is varied, the quantity of thiourea is varied proportionately, to satisfy both the Cd and the Al in forming the final compounds.

In all cases, the preferred end result is that directly in contact with the $SnO_x$ is a layer of CdS heavily impregnated with aluminum and at the upper surface of the layer of CdS, which is to be converted to $Cu_xS$ to form a heterojunction, there is no aluminum or very little aluminum. Two distinct layers may be employed, or a decreasing percentage of aluminum in proceeding from bottom to top of the layer.

The solutions are sprayed on the glass intermittently and slowly in successive passes over a considerable period of time, of the order of 10–40 minutes for the first coating and 10–40 minutes for the second coating, in Examples I and IA, and in the order of 20–60 minutes in the case of the graduated layer, and intermittently and over only a small portion of the glass at any one instant so that the glass sheet always remains at the same average temperature during the spraying, despite the heat removed from the glass in the spraying process. The total thickness of the layer formed in this way is between about 2 to 4 microns, or less. The coated plate is, after spraying is completed, heated to a temperature of about 450° C to 550° C for approximately 15 minutes.

It should be noted that although the preferred method of forming a CdS film which is impregnated with Al is via the spray method above described, other methods of forming such a film may be employed. Thus, the CdS film, which is impregnated with Al, may be formed by vacuum deposition, dipping, electroplating, or any other suitable means by which films are deposited on a substrate, as known in the art. Although we are of the belief that the best such films are formed using the spray method, these other well-known methods of forming a film may also be utilized.

After the CdS layer has been formed, the bath is slowly cooled, and the coated product may then be removed.

To complete a photovoltaic cell, the exposed surface of the CdS layer is converted to $Cu_xS$ by dipping the previously cooled cell into an appropriate solution at room temperature, by electroplating, by a combination of dipping and electroplating, or by spraying thereon a suitable copper containing solution.

The solution employed to form a $Cu_xS$ layer by dipping may be in proportions as follows:

EXAMPLE I 100 cc : Water
7 cc : $HNO_3$ (5-1)
1.5 gm : (L+)-Tartaric Acid
1.5 gm : CuCl
1.5 gm : $H_4Ce(SO_4)_4$
1.5 gm : NaCl The tartaric acid is a typical organic acid and for it may be substituted citric or lactic acid. The presence of $H_4Ce(SO_4)_4$ appears to add an increment of about 50 millivolts of voltage to the final cell, but the manner in which it functions in the process is not understood. For NaCl may be substituted another halide, as $NH_4Cl$. The $HNO_3$ is optional.

Another solution which may be utilized in the dipping process is:

EXAMPLE II 700 cc : Water
7 gm : Citric acid monohydrate
30 gm : $NH_4Cl$
3.5 gm : CuCl As with the EXAMPLE I solution, another halide may be substituted for $NH_4Cl$.

A preferred solution employed in electroplating to form $Cu_xS$ is:

EXAMPLE I 700 cc : Water
3.9 gm : Citric acid monohydrate
2.0 gm : $NH_4Cl$
7.5 gm : Cupric acetate pentahydrate The $NH_4Cl$ may be omitted, but seems to improve the quality of the cells by a small factor. Plating is accomplished at a current density of 0.5 ma per cm$^2$ for 2-5 minutes, with the CdS layer negative with respect to a copper anode.

EXAMPLE II 700 cc : Water
10 gm : Cupric acetate pentahydrate
15 cc : Acetic acid (20%)

EXAMPLE III 700 cc : Water
7 gm : Citric acid monohydrate
1.2 gm : $NH_4Cl$
5 gm : Cupric acetate pentahydrate As indicated above, a combination of dipping and electroplating may be used in forming the $Cu_xS$ layer. Alternatively, a suitable solution may be sprayed onto the CdS film to form the $Cu_xS$ layer.

After the $Cu_xS$ formation process is completed, a deposit of copper may be applied over the $Cu_xS$ to a thickness of about 7,000 A and aluminum or another suitable metal is then coated over the copper to protect the copper from oxidation and from the effects of moisture and airborne impurities.

The present method can be employed with Nesa glass as the starting material, obviating the need for coating with $SnO_x$, but Nesa glass has a sheet resistivity per square of about 50-75 ohms per square, whereas by our methods very low resistivity coatings may be produced, i.e., of the order of 1-20 ohms per square. The use of low resistivity coatings of $SnO_x$ increases the efficiency of the cell by decreasing the amount of energy which is lost in the $SnO_x$.

Reference has been made hereinabove to the use of very intense ultraviolet light while spraying the cadmium sulphide forming solution. The precise intensity of the irradiation has not been measured, but four 150 watt ultraviolet lamps have been placed within a few inches of a small surface being sprayed, and the ultraviolet light found to be advantageous. If there is no irradiation during spraying, the cells sometimes have relatively lower outputs than occurs in the presence of intense ultraviolet light.

It also appears to be important to the process that the spraying occur by depositing droplets which are as uniform as possible. If the spray consists of many small and many large droplets, the very small droplets are evaporated by the intense heat, approximate to the exposed surface of the substrate, and only the larger droplets reach the substrate. This causes some wastage of CdS and it implies that the rate at which the spray is applied must take into account the nonuniformity of the droplets.

In accordance with the method of our parent application, supra, the glass substrate will be moving longitudinally along a trough or tank containing molten material, and the spray will occur by transverse passes across the substrate as the glass moves, so that the total quantity of spray reaching any given small area of the substrate will be uniform. The method allows for the fact that spray out of an air gun or out of an electrostatic spray gun does not have a uniform pattern.

After a cell is completed, including electrodes, it is heated to 400° F to 500° F.

The present cell is to be exposed to solar radiation via its glass substrate. The presence of Al in the CdS does not materially affect transparency of the CdS-Al layer, so that the heterojunction may be exposed via the latter.

It should be understood that various changes, modifications, and variations in the structure and function of the present invention may be effected without departing from the spirit and scope of the present invention as defined in the appended claims.

What we claim is:

1. A method of making a photovoltaic cell of the type having an insulating substrate, a first conductive layer, a second layer comprised of CdS, and a third layer forming a heterojunction with said second layer, comprising the step of forming at least a portion of said CdS layer with a composition comprising a cadmium salt, a sulphur containing compound, and an aluminum containing compound, the aluminum content of the composition being at least 10 molar percent of the total metal content of the composition.

2. The method according to claim 1, further comprising the step of heat treating said CdS layer in an oxygen containing atmosphere at a temperature in the range 450° C to 550° C at some time prior to forming said third layer.

3. The method according to claim 1, wherein said aluminum containing compound is $AlCl_3$.

4. The method according to claim 1, wherein said second layer is sprayed to a thickness of about 2 to 4 microns.

5. The method according to claim 1, wherein the composition is a water solution.

6. The method according to claim 1, wherein the cadmium salt is $CdCl_2$.

7. The method according to claim 1, wherein the sulphur containing compound is thiourea.

8. The method according to claim 1, wherein the method includes the further step of irradiating said CdS layer with ultraviolet light during its formation.

9. A method of making a photovoltaic cell on an insulating substrate comprising the step of applying a solution comprising a cadmium salt, a sulphur containing compound, an aluminum containing compound, and a solvent, the aluminum content of the solution being at least 10 molar percent of the total metal ion content, to form a film of CdS containing aluminum.

10. A method of making a photovoltaic cell comprising the step of applying over an insulating substrate a composition containing a cadmium salt, a sulphur containing compound, and an aluminum containing compound, the aluminum content of the composition being at least 10 molar percent of the total metal content of the composition, to form a film of CdS containing aluminum.

11. A photovoltaic cell fabricated in accordance with the method of claim 10.

12. A method of making a photovoltaic cell of the type having an insulating substrate, a first conductive layer, a second layer comprised of one or more stratums of CdS, and a third layer forming a heterojunction with said second layer, comprising the steps of:
maintaining the substrate having the first layer thereon at a constant temperature in the range 500° F – 1100° F;
spraying onto the first layer a solution comprising a cadmium salt, a sulphur containing compound, an aluminum containing compound, and a solvent, the aluminum content of the solution being at least 10 molar percent of the total metal ion content of the solution, to form a first stratum of the second layer comprised of CdS containing aluminum; and
spraying onto the first stratum of the second layer a solution comprising a cadmium salt, a sulphur containing compound, and a solvent, to form a second stratum of the second layer.

13. The method according to claim 12, further comprising the step of converting the exposed surface of the second layer to $Cu_xS$ by a method including ion exchange.

14. The method according to claim 12, wherein the method includes the further step of irradiating the second layer with ultraviolet light during the spray process.

15. The method according to claim 12, further comprising the step of heat treating the cell in an oxygen containing atmosphere at a temperature in the range 450° C to 550° C at some time prior to formation of said third layer.

16. The method according to claim 15, wherein said aluminum containing compound is $AlCl_3$.

17. The method according to claim 15, wherein said second layer is sprayed to a thickness of about 2 to 4 microns.

18. The method according to claim 15, wherein the solvent is water.

19. The method according to claim 15, wherein the cadmium salt is $CdCl_2$.

20. The method according to claim 15, wherein the sulphur containing compound is thiourea.

21. A method of making a photovoltaic cell including forming a film containing CdS and aluminum on a conductive film formed over an insulation substrate comprising maintaining said substrate uniformly at a temperature in the range 500° F–1100° F while spraying CdS forming solutions, in sequence, said solutions including the proportions, first:
2 liters Water
60 cc : 1 Molar $CdCl_2$ solution
68 cc : 1 Molar thiourea solution
1.95 gm $AlCl_3$. $6H_2O$ and, second:
5 liters Water
150 cc : 1 Molar $CdCl_2$ solution
150 cc : 1 Molar thiourea solution.

22. A method of making a photovoltaic cell including forming a film containing CdS and aluminum on a conductive film formed over an insulating substrate, which includes the steps of maintaining said substrate at a constant temperature in the range 500°–1100° F while spraying thereon a water solution of $CdCl_2$, thiourea and soluble aluminum containing salt, the aluminum content of said solution being at least 10 molar percent of the total metal ion content of the solution.

23. The method according to claim 22, wherein said aluminum containing salt is $AlCl_3$.

24. The method according to claim 22, wherein said film is sprayed to a thickness of about 2–4 microns.

25. The method according to claim 22, further comprising the step of depositing a further film consisting of essentially only CdS on said film containing cadmium sulfide and aluminum.

26. The method according to claim 22, wherein the method includes a further step of spraying a solution consisting essentially of cadmium chloride and thiourea on said film containing cadmium sulfide and aluminum to form a further film of cadmium sulfide.

27. The method according to claim 26, wherein the method includes the further step of heating said substrate after said further cadmium sulfide film is formed to a temperature in the range 450° C to 550° C.

28. The method according to claim 27, wherein the method includes the further step of coating said further cadmium sulfide film with the $CU_xS$ after the heating step is completed.

29. The method according to claim 27, wherein the method includes the further step of said further cadmium sulfide film a solution including CuCl.

30. The method according to claim 27, wherein is included the further step of coating said further cadmium sulfide film with a solution essentially in the proportions:
700 cc : Water 1.4 cc : HNO$_3$ (5-1)
1.5 gm : CuCl
1.5 gm : H$_2$Ce(SO$_4$)$_4$
1.5 gm : NaCl
1.5 gm : (L+)-Tartaric acid 31. The method according to claim 30, wherein the method includes the further step of applying an electrode to said cell.

32. The method of fabricating a photovoltaic cell on an insulating substrate including forming a film of CdS including at least a stratum containing aluminum, which film is formed by applying over said substrate a composition having an aluminum content of at least 10 molar percent of the total metal content of the composition, forming on said layer containing CdS and aluminum a further film of CdS which is substantially free of said aluminum, and forming over said further film of CdS a layer of Cu$_x$S.

33. The method according to claim 32, wherein said layer of Cu$_x$S is stoichiometrically Cu$_2$S.

34. The method according to claim 32, wherein said layer of Cu$_x$S is formed by a method including ion exchange.

35. The process of fabricating a photovoltaic cell, comprising applying over an insulating substrate a film of CdS containing aluminum in a lower stratum of the cross-section of said film and substantially no aluminum in the remaining cross-section of the film, which is formed by initially using a composition having an aluminum content of at least 10 molar percent of the total metal content of the composition and then using a composition having little or no aluminum content.

36. The method of making a CdS-Cu$_x$S photovoltaic cell which includes forming by ion exchange a layer of Cu$_x$S on a layer of CdS, said layer of CdS being about 2 to 4 microns in thickness and including aluminum, at least through a portion of its thickness, formed by applying over an insulating substrate a composition having an aluminum content of at least 10 molar percent by weight of the total metal content of the composition.

37. A method of making a photovoltaic cell, comprising the step of forming over an insulating substrate a layer of CdS containing Al in an amount effective to inhibit permeation through said layer of a solution capable of forming Cu$_x$S when applied to said layer of CdS.

38. A photovoltaic cell fabricated in accordance with the method of claim 37.

39. The method of making a photovoltaic cell, comprising forming on a conductive film formed over an insulating substrate a layer of CdS containing aluminum in an amount effective to inhibit permeation to said conductive film of a solution capable of forming Cu$_x$S when applied to said layer of CdS and forming a layer of Cu$_x$S over said layer of CdS by applying to said layer of CdS said solution capable of forming Cu$_x$S.

40. The method according to claim 37, wherein said layer of Cu$_x$S is applied by dipping said substrate in a solution, maintained at a temperature less than 25° C, containing a copper containing compound for ion exchange of Cu for Cd.

41. A method of making a photovoltaic cell including forming a film of CdS microcrystals on a conductive surface of a substrate, comprising maintaining said substrate uniformly at a temperature in the range 500° F-1100° F while spraying thereon CdS forming solutions, in sequence, said solutions including the proportions, first:

8 liters: Water
18.63 gm: CdCl$_2$ · 2½ H$_2$O
8.77 gm: Thiourea
6.96 gm: AlCl$_3$ · 6H$_2$O
2 cc: Hydrochloric acid and, second:
4 liters: Water
24.70: CdCl$_2$ · 2½ H$_2$O
10.96 gm: Thiourea 42. A method of making a photovoltaic cell comprising forming over an insulating substrate a layer of CdS including at least a stratum containing aluminum, which layer is formed by using a composition having an aluminum content of at least 10 molar percent of the total metal content of the composition, and forming a layer of Cu$_x$S over said layer of CdS by electroplating in a copper containing solution to accomplish ion exchange of Cu for Cd.

43. The process according to claim 42, wherein said step of forming a layer of Cu$_x$S by ion exchange is conducted in an electrolyte containing cupric acetate from a copper anode.

44. The process according to claim 42, wherein said solution is in the proportions:
700 cc: H$_2$O
10 gm: Cupric acetate pentahydrate
15 cc: Acetic acid (20%)

45. The process according to claim 42, wherein said solution is in the proportions:
700 cc: H$_2$O
3.9 gm: Citric acid monohydrate
2.0 gm: NH$_4$Cl
7.5 gm: Cupric acetate pentahydrate.

46. The process according to claim 42, wherein said solution is in the proportions:
700 cc: H$_2$O
3.9 gm: Citric acid monohydrate
7.5 gm: Cupric acetate pentahydrate.

47. The process according to claim 42, wherein said solution is in the proportions:
700 cc: H$_2$O
7 gm: Citric acid monohydrate
1.2 gm: NH$_4$Cl
5 gm: Cupric acetate pentahydrate.

48. The process according to claim 42, wherein said ion exchange is accomplished at a current density of about 0.5 ma per cm$^2$ for 2-5 minutes.

49. A method of making a photovoltaic cell on an insulating substrate of the type having a layer of CdS at least a stratum of which contains aluminum in an amount effective to inhibit penetration by copper containing solutions comprising forming a layer of Cu$_x$S over said layer of CdS by ion exchange of Cu for Cd by a combination of dipping the cell in a first copper containing solution and electroplating in a second copper containing solution.

50. A method of making a photovoltaic cell, comprising the step of applying over an insulating substrate a solution comprising a cadmium salt, a sulphur containing compound, hydrochloric acid, a solvent, and an aluminum containing compound, the aluminum content of the solution being at least 10 molar percent of the metal content of the solution, to form a film of CdS containing aluminum.

51. A method of making a photovoltaic cell comprising the step of applying over an insulating substrate a composition comprising a cadmium salt, a sulphur containing compound, hydrochloric acid, and an aluminum containing compound, the aluminum content of the composition being at least 10 molar percent of the metal content of the compositon, to form a film containing CdS and aluminum.

52. A method of making a photovoltaic cell of the type having an insulating substrate, first layer of conductive material, a second layer having at least a portion containing aluminum in an amount effective to inhibit penetration of a solution containing a heterojunction-forming material through said second layer to said first layer, a third layer forming said heterojunction with said second layer, wherein at least one of the layers is deposited thereon by a spray process using a spray comprised of essentially uniform droplet sizes.

53. A photovoltaic cell comprising a plurality of films wherein at least one of the films is formed by the method described in claim 52.

54. The method of fabricating a photovoltaic cell comprising the step of forming over an insulating substrate a layer comprised of CdS and containing aluminum in an amount effective to inhibit permeation through said layer of a solution of a material forming a heterojunction with said CdS by a spray process conducted while said substrate is maintained at a constant temperature by contacting a portion of said substrate with a molten material, by said spray process being conducted in repeated intermittent stages, each of said stages spraying only a portion of said surface at any instant of time, and at a sufficiently small rate of spray, so that said molten material is able to supply heat to said substrate at a rate sufficient to maintain the temperature of said substrate essentially constant during the spray process.

55. A photovoltaic cell fabricated in accordance with the method of claim 54.

56. A method of fabricating a photovoltaic cell on an electrically conductive surface of an insulating substrate comprising:

heating said substrate to maintain said substrate at a constant temperature while leaving said electrically conductive surface exposed;

spraying onto said electrically conductive surface a solution of plural compounds which interact on said surface to form a layer of CdS at least a portion of which contains aluminum in an amount effective to inhibit permeation through said layer by a solution of material forming a heterojunction with said CdS;

said spray process being conducted in repeated, intermittent stages, each of said stages spraying only a portion of said surface at any instant of time and at a sufficiently small rate of spray to maintain the temperature of said surface essentially constant during the spray process.

* * * * *